United States Patent [19]

Benhamida

[11] Patent Number: 5,146,115
[45] Date of Patent: Sep. 8, 1992

[54] DOMINO-LOGIC DECODER

[75] Inventor: Boubekeur Benhamida, Boise, Id.

[73] Assignee: Zilog, Inc., Campbell, Calif.

[21] Appl. No.: 736,403

[22] Filed: Jul. 26, 1991

[51] Int. Cl.$^5$ .............................. H03K 19/00
[52] U.S. Cl. ................................ 307/452; 307/246; 307/443
[58] Field of Search ............... 307/246, 443, 451, 452

[56] References Cited

U.S. PATENT DOCUMENTS

| | | | |
|---|---|---|---|
| 4,780,626 | 10/1988 | Guerin et al. | 307/452 X |
| 4,849,658 | 7/1989 | Iwamura et al. | 307/570 X |
| 5,041,742 | 8/1991 | Carbonaro | 307/452 |
| 5,051,620 | 9/1991 | Burgin | 307/452 |
| 5,059,825 | 10/1991 | Yoshida | 307/452 X |

Primary Examiner—Robert J. Pascal
Attorney, Agent, or Firm—Majestic, Parsons, Siebert & Hsue

[57] ABSTRACT

A domino-logic decoder which decodes an input in an amount of time substantially independent on the bit size of the input. An address is input to a stack of at least two individually gated transistors in the decoder. A first node at one end of the stack is connected to a charge restoring transistor and a strobing transistor, both coupled to a strobe signal. A second node coupled to the strobing transistor provides the decoder output and operably indicates that a particular portion of the decoder has been selected. During operation, the first node is charged and the second node is isolated from the first node by the strobing transistor. After the inputs have fully charged the input transistors and a path to ground is formed, the first node will be discharged. The second node is discharged across the strobing transistor during the strobe phase, indicating that a particular decoder portion has been chosen. Body effect is also eliminated.

8 Claims, 2 Drawing Sheets

DOMINO-LOGIC DECODER

BACKGROUND OF THE INVENTION

This invention relates to a novel domino-logic decoder. More specifically, this invention relates to a modified domino decoder which includes circuitry which may be utilized in other types of electrical applications, and which does not suffer from body effect.

Domino logic is a type of sequential logic circuitry oftentimes utilized in decoders. Decoders are often used to select the appropriate portion of a computer memory depending upon the particular address input to the decoder. Domino logic usually refers to a cascaded set of dynamic logic blocks in which each stage evaluates and causes the next stage to evaluate, in the same manner that a stack of dominos fall. Any number of logic stages may be cascaded, but it must be possible to evaluate the sequence within a certain clock phase. A single clock can be used to precharge and evaluate all logic gates within a block.

One type of prior art domino decoder includes a plurality of input lines which are each input to a transistor. The transistors are coupled together in series and connected to a ground potential at one end. The decoder includes two phases of operation: a pre-charge phase, and a strobing phase. When the decoder is enabled, the transistors begin charging to the values which are input by the input lines. A discharge transistor is coupled between the input transistors and ground to prevent the transistors from discharging to ground during the pre-charge phase. A node adjacent to the top transistor charges up with time since there is no path to ground. During the strobing phase, a strobe signal disables the discharge transistor. The node adjacent to the top transistor is discharged across each of the input transistors sequentially to produce the output signal, which indicates that that particular portion of the decoder has been selected. Since the node must discharge across each of the transistors in the stack, the total discharge time increases with the number of transistors. The speed of this type of domino logic is thus limited by the number of input lines, which corresponds to the number of transistors across which a node must discharge. The decoding time affects how quickly a memory address may be accessed. Thus, it is important that the decoding time be minimized in order to increase a computer's overall processing speed.

Another problem with this type of domino-logic decoder is that it suffers from body effect. Body effect refers to the modification of a transistor's threshold voltage with a voltage difference between the source and the substrate. For instance, if a number of transistors are coupled in series, the transistor at the output will switch slower than the other transistors if the source potential of this transistor is not the same as the substrate. The switching time of the series is reduced because the transistor at the output takes longer to discharge.

The difficulties in the preceding are not intended to be exhaustive but rather are among many which may tend to reduce the usefulness of prior art domino-logic decoders. Other noteworthy problems may also exist; however, those presented above should be sufficient to demonstrate that domino decoders appearing in the past will admit to worthwhile improvement.

It is therefore a general object of the invention to provide a novel domino-logic decoder which will obviate or minimize difficulties of the type previously described.

It is a specific object of the invention to provide a domino-logic decoder which can decode an input in an amount of time which is substantially independent of the number of the inputs.

It is another object of the invention to provide a domino-logic decoder which reliably decodes an input in a shorter amount of time than domino decoders of the prior art.

It is still another object of the invention to provide a domino-logic decoder which does not suffer from body effect.

SUMMARY OF THE INVENTION

A preferred embodiment of the present invention which accomplishes the foregoing objects includes a decoder having novel circuitry which may be used in other applications. The circuit includes a stack of transistors connected in series, each transistor being individually gated to accept a bit of an input address. One end of the stack is connected to ground and the other end is connected to a strobing transistor at a first node. A charge restoring transistor is also coupled to the first node. During the decoder pre-charge phase, an address is input to the transistors, and the first node is discharged when all of the transistors are conducting. The second node is separated from the first node by the strobing transistor. During the strobing phase, the strobing transistor conducts and the second node is discharged if the first node is at a ground potential, thereby choosing that particular portion of the decoder. The circuit design enables the address to be decoded in a time that is substantially independent of the bit size of the input address. Additionally, body effect is eliminated.

DESCRIPTION OF THE DRAWINGS

Other advantages of the present invention will become apparent from the following detailed description of a preferred embodiment thereof taken in conjunction with the accompanying drawings, wherein.

DETAILED DESCRIPTION

Prior Art

Figure 1:
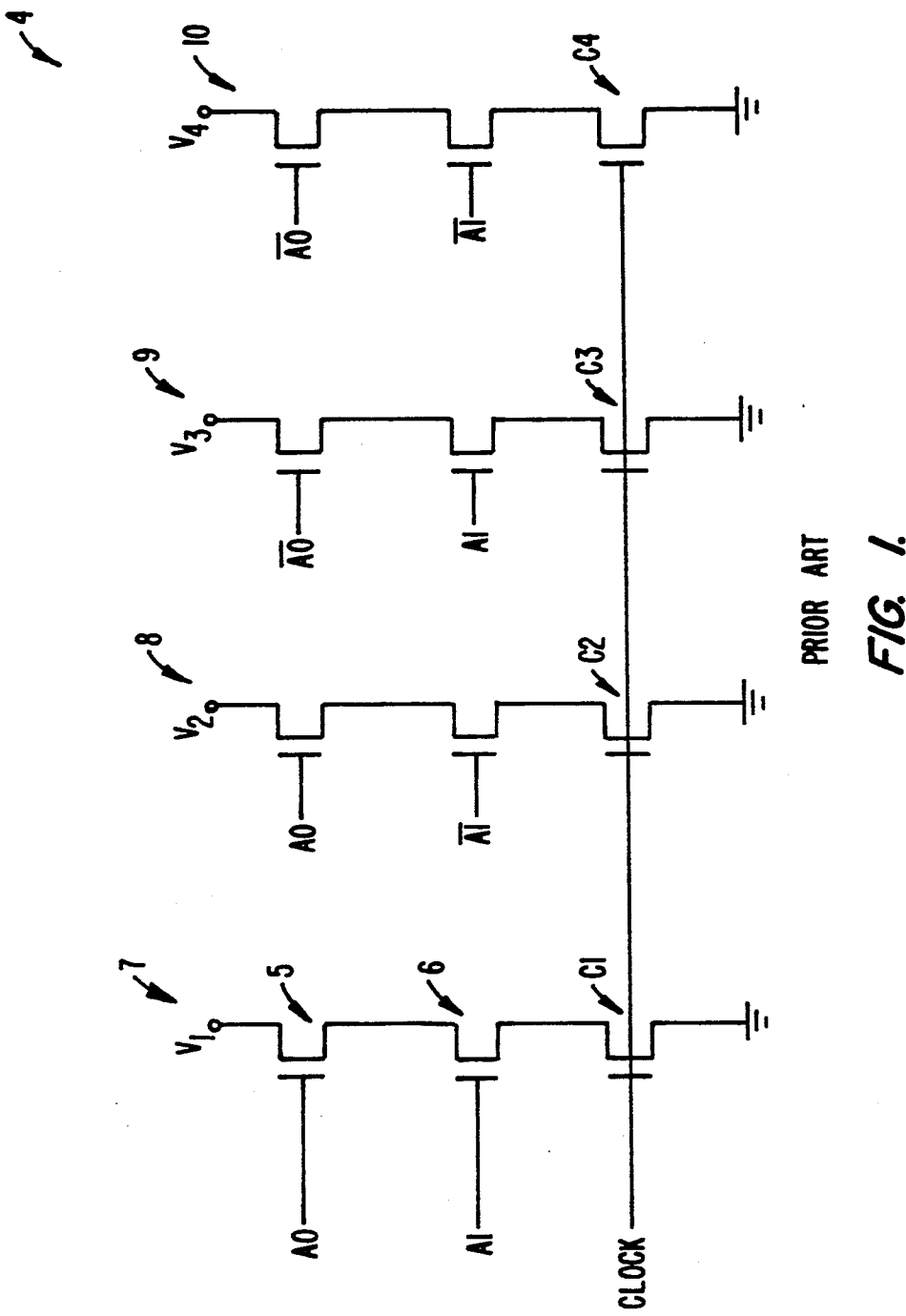
FIG. 1 is a schematic circuit diagram illustrating a two bit domino-logic decoder of the prior art comprising four cascaded sections.

Referring now to the figures, and initially to FIG. 1, shown is a simplified schematic drawing of a conventional domino-decoder circuit 4 accepting a two-bit input for decoding. As is well known, multiple bit addresses are input to a decoder to produce a unique, mutually exclusive output for each of the possible input combinations. The input to decoder circuit 4 includes lines A0 and A1, which are input to transistors 5 and 6 as shown. Transistors 5 and 6 form a portion 7 of the decoder. The input is altered so that A0 and A1 are input portion 8, A0 and A1 are input to portion 9, and A0 and A1 are input to portion 10. Portions 7–10 are cascaded together to form the decoder as shown. To illustrate the operation of the decoder, suppose that the address input to the decoder circuit 4 is A0, A1. Also assume that there is initially a voltage at nodes V1, V2, V3, and V4. The clock signal blocks the path to ground through transistors C1-C4 until the transistors are fully charged by their inputs. The inputs will make the transistors in portion 8 conductive, permitting the voltage stored at node V2 to discharge to ground and pull that node LOW after the clock has enabled transistor C2. In this example, a LOW voltage at output node V2 indicates that portion 8 of the decoder has been chosen.

Figure 2:
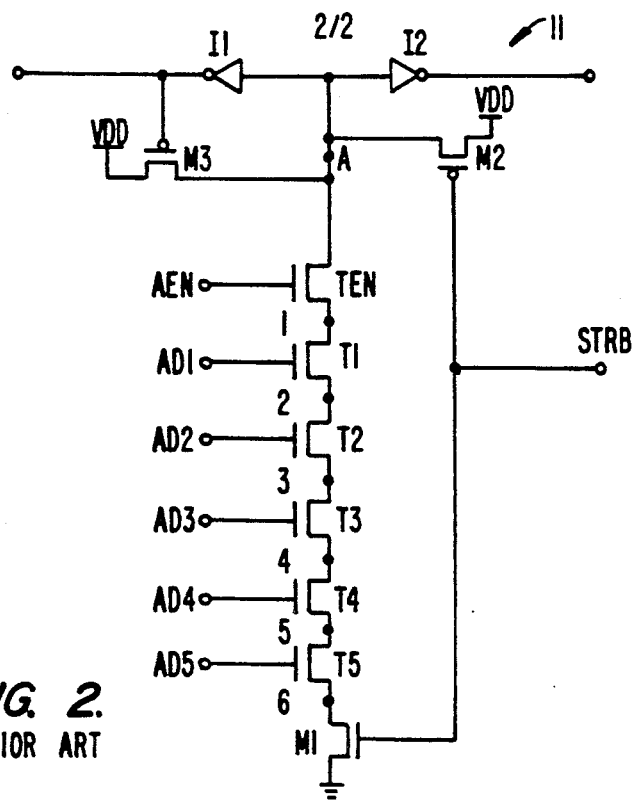
FIG. 2 is a schematic circuit diagram illustrating a portion of a five bit domino-logic decoder of the prior art.

FIG. 2 shows a decoder circuit 11 which is a portion of a standard prior art domino logic decoder analogous to portion 7, for example, of FIG. 1. More specifically, the decoder may accept n bits of binary information and convert them to up to $2^n$ unique outputs. Only one of the components of an entire decoder is shown; since there are five input lines AD1-AD5, there will be $2^5 = 32$ possible outputs. Therefore, 32 of the components shown in FIG. 2 will form a complete decoder after being connected similarly to the way the portions are connected in FIG. 1. Again, only one portion of the component is shown here to facilitate an understanding of the decoder and to simplify the drawings, but it will be understood that in this particular configuration, 32 of the same components are connected together to form a decoder.

The prior art domino decoder circuit 11 includes a plurality of input lines AD1-AD5 which are input to n-channel transistors T1-T5, respectively. The input lines are each shown as being HIGH, but it will be understood that the input lines will be arranged such that each input combination will be input to the appropriate decoder portion. The bottom transistor T5 is connected to ground via an n-channel transistor M1, which is controlled by a strobe signal STRB. The STRB signal is also input to a second transistor M2, a p-channel feedback transistor coupled to a voltage supply as shown, such that transistors M1 and M2 are oppositely ON and OFF. The operation of the decoder will be explained below. Transistor M2 is coupled to a weak p-channel transistor M3, which is also coupled to the voltage supply. The node common to transistors M2 and M3 is denoted "A". Inverters I1 and I2 are coupled to the transistors M2, M3 as shown. The function of transistor M3 and inverters I1, I2 will be explained below in conjunction with an explanation of FIG. 3.

Input line AEN is the decoder address enable and indicates to each decoder component, such as the one shown as circuit 11, that the current input address is valid. When the value of AEN is a logic "1", the decoder will be in operation. To facilitate an understanding of the prior art decoder 11, it will be assumed that the STRB signal is a logic low, or "0", and all input lines AD1-AD5 are logic HI, or "1". Transistor M2 will therefore be ON, and transistor M1 will be OFF. When the enable line AEN is high or ON, and STRB is low or "0", all intermediate diffusion nodes of transistors TEN T1-T5 and M1 charge up. M1 is OFF so that the transistors cannot discharge to ground. Node A is charged to VDD because transistor M2 is conducting. Lines AD1-AD5 stabilize before the STRB signal goes high. When the STRB signal goes high, transistor M2 is turned OFF and transistor M1 is turned ON and conducts.

Since all of the inputs to the decoder circuit 11 have logic values of "1", all of the transistors will conduct and node A will discharge to ground. When node A discharges to ground, this portion of a decoder is selected, and may, for example, indicate the appropriate location in RAM for the input address. The output of each of a plurality of the circuits 11 which form a decoder is taken at either the WLL (Word Line Left) or WLR (Word Line Right). There will be only one decoder component which outputs a logic high. The amount of time it takes for node A to discharge depends upon the number of stacked transistors. Node 6 is discharged first through transistor M1, node 5 is discharged next through transistor T5, etc., and node A is discharged last through transistor TEN, just as a stack of dominos fall. In the case where there are many input lines, the discharge time of node A will have an undesirably long delay after STRB goes high. This type of domino decoder also suffers from body effect, which is present on every transistor in the stack. The present invention overcomes the time delay problem and body effect phenomenon encountered in prior art domino-logic decoders, such as the one shown in FIG. 2.

DESCRIPTION OF A PREFERRED EMBODIMENT

Figure 3:
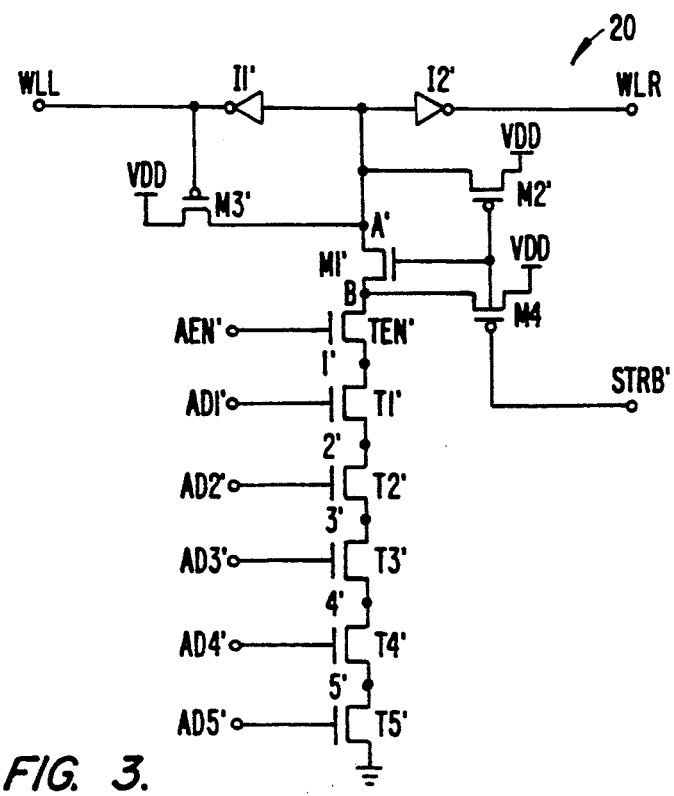
FIG. 3 is a schematic circuit diagram illustrating a portion of the domino-logic decoder of the present invention.

FIG. 3 shows the domino decoder circuit 20 of the present invention. The improved domino decoder is formed by cascading as many as 32 of the circuits 20, just as the circuit 11 of FIG. 2 could be cascaded. To facilitate a comparison of the two circuits 11 and 20, analogous portions of the circuit 11 in FIG. 2, such as the input line AEN, will be labelled with a prime (') in FIG. 3, such that the input line is labelled "AEN'" in FIG. 3. The modified domino-logic decoder circuit 20 includes input lines AD1'-AD5', which are coupled to transistors T1'-T5', respectively. Note that there is no transistor coupled to the bottom transistor T5', as there is (M1) in FIG. 2.

The domino-logic decoder circuit 20 includes a charge restoring transistor M4 coupled to a strobe signal STRB'. A strobing transistor M1' is coupled to the top of the transistor stack at a node B, as shown in FIG. 3. Transistors M4 and M2' are p-channel devices and transistor M1' is an n-channel device. Transistor M3' and inverters I1' and I2' function in the same way as in FIG. 2. When the strobe input at STRB, is a logic low or "0", transistors M4 and M2, are both ON, and transistor M1' is OFF. Node A' is charged through transistor M2'. Node B is also charged through transistor M4, a charge restoring weak p-channel device, by VDD. Node A' is isolated from node B by transistor M1' since it is turned OFF. Thus, node A' is charged when the strobe signal STRB' is logic low, or "0". All of the inputs AD1'-AD5' are logic high, or "1" (AEN will be a "1" because it enables the decoder). The associated transistors AEN' and T1'-T5' will therefore conduct and node B will be discharged through the stack of transistors, thus eliminating the body effect. (If the input lines are not all logic high or "1", node B will of course not discharge). All intermediate source-drain capacitances of transistors T1-T5 will be charged by device M4 during the pre-charge phase (when STRB=0).

When the strobe signal STRB' changes to a logic high, transistors M2' and M4 will turn OFF, and transistor M1' will turn ON. If AD1'-AD5' are all high, node A' will discharge to ground because node B is at a ground potential, and this particular component of the decoder formed of multiple circuits 20 will be selected. Since node A' need only discharge across transistor M1' to reach a ground potential, the amount of time it takes for node A' to discharge is much shorter than in circuit 11 of FIG. 2. Thus, there is no domino effect and the node discharge time is substantially independent of the number of transistors coupled to the circuit input lines. If a particular decoder is not selected (not all address lines AD1'-AD5' are high), node B remains at VDD potential, and node A' will not share its charge with node B nor any of the other N+ parasitic diffusion capacitances of transistors T1'-T5'. The decoder circuit 20 operates at a much higher frequency than the decoder circuit 11 of the prior art because the domino effect, as well as body effect, is eliminated.

Charge restoring transistor M4 insures that any charge on node A' will not be shared with the transistors TEN, and T1'-T5' when the transistor M1' is turned ON. More specifically, when the strobe signal is high and transistors M2' and M4 are nonconducting, the charge at node A' will discharge to ground if node B is at a ground potential. However, if node B is not at a ground potential (the case if the input lines are not all "1", or HIGH), node A' cannot discharge to ground. In the absence of transistor M4, it is possible that the charge stored at node A' will be redistributed across all the N+ diffusion capacitances of transistors AEN', TEN, and T1'-T5', making node A' voltage fall below the switch point of inverters I1' and I2' and erroneously enabling the decoder. Since transistor M4 is a weak restoring device, it prevents the decoder from being erroneously enabled by acting as a charge source during the pre-charge phase, and prevents the charge at node A' from being shared by the transistor stack during the strobing phase.

Transistor M3' maintains the charge at node A' when transistor M2' is OFF. The outputs of the decoder are taken at both WLL and WLR, depending upon the specific use of the decoder. If the WLL or WLR outputs are logic low, or "0", the decoder has not been selected. When the inputs to the decoder AD1'-AD5' are logic high or "1", the decoder is selected; the decoder basically acts as an AND gate.

After reading and understanding the foregoing modified domino-logic decoder, in conjunction with the drawings, it will be appreciated that several distinct advantages of the subject invention are obtained. The improved domino decoder circuit 20 permits an address to be decoded in a time which is essentially independent of the size of the input address, to a certain extent. By positioning the strobing transistor M1' at the top of the domino stack, the decoder formed by a plurality of circuits 20 is faster than the prior art domino decoders. The inclusion of the pre-charge transistor M4 insures that the decoder is not erroneously enabled because M4 acts as a charge source. Additionally, body effect is eliminated by the novel circuit configuration.

It should be noted that although the invention has been described with reference to a specific embodiment, it should not be construed to be so limited. For instance, the transistors shown are implemented using MOSFETs, but they could be replaced with junction field effect or bipolar junction transistors. The circuit may be altered to use a current supply instead of a voltage supply. Additionally, the improved circuit may be used for applications other than decoders. The circuitry may be used with ROMs, PLAs, or other types of decoders. The circuit is basically an AND gate, and thus has a variety of applications which will not be discussed here, but will be understood to be covered by the instant invention. Those skilled in the art and familiar with the instant disclosure of the subject invention may recognize additions, deletions, modifications, substitutions and other changes which will fall within the purview of the subject invention and claims.

What is claimed:

1. In a circuit for use with a decoder, said circuit having a first node and a second node and a stack of transistors connected in series between the first node and the second node, the transistors being individually gated, the improvement comprising:
 a strobe transistor being positioned at the top of the stack and being coupled to the first node and a third node, said strobe transistor discharging the first node in response to the strobe signal; and
 a charge restoring transistor coupled to the third node and being gated by the strobing signal, said charge restoring transistor connecting said third node to a power supply, such that said charge restoring transistor charges the third node when said strobe transistor is nonconductive.

2. The circuit as defined in claim 1 wherein said strobe transistor further isolates the first node from the third node when the third node is being discharged.

3. The circuit as defined in claim 1 wherein said strobe transistor is positioned between said first node and said second node, such that said strobe transistor is part of the stack of transistors.

4. The circuit as defined in claim 1 wherein a plurality of said circuits are connected together to form a decoder.

5. The circuit as defined in claim 1 wherein said strobe transistor comprises an n-channel device, and said charge restoring transistor comprises a p-channel device.

6. A circuit for use with a decoder, said circuit being connected to a strobe signal, said circuit comprising:
 a charge restoring device having an input and an output, said input being connected to the strobe signal;
 a pre-charge device having an input and an output, the input of said pre-charge device being connected to the strobe signal in a manner that said pre-charge device becomes conductive when the charge restoring device becomes conductive, wherein said charge restoring gate and said pre-charge device are both either conducting or nonconducting at the same time;
 a strobing device having an input connected to the strobe signal, said strobing device being coupled between said charge restoring device and said pre-charge device at a first node, said strobing device being in a conducting state when said charge restoring gate and said pre-charge device are in a nonconducting state, and said strobing device being in a nonconducting state when said charge restoring device and pre-charge device are in a conducting state.

7. A circuit for use in a decoder, said circuit comprising:
 a plurality of individually gated transistors, said transistors each accepting a bit of a multi-bit input and being connected in series between a first node and a second node;
 a strobing transistor being connected to said second node and a third node, said strobing transistor being gated by a strobing signal and storing charge at said third node;

a charge restoring transistor being coupled to said second node and being gated by the strobing signal;
a pre-charge transistor being coupled to said third node and being gated by the strobing signal;
wherein when all of said plurality of individually gated transistors form a path to ground and said second node is at a ground potential, said strobing transistor conducts to discharge said third node to ground, thereby producing an output in a time substantially independent of the number of input transistors.

8. The circuit as defined in claim 7 wherein a plurality of said circuits are connected together to form a decoder.

* * * * *